(12) United States Patent
Davis et al.

(10) Patent No.: US 9,928,136 B2
(45) Date of Patent: Mar. 27, 2018

(54) MESSAGE STORAGE IN MEMORY BLOCKS USING CODEWORDS

(71) Applicant: Microsoft Technology Licensing, LLC, Redmond, WA (US)

(72) Inventors: John D. Davis, San Francisco, CA (US); Parikshit Gopalan, Sunnyvale, CA (US); Mark Manasse, San Francisco, CA (US); Karin Strauss, Seattle, WA (US); Sergey Yekhanin, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 128 days.

(21) Appl. No.: 15/011,929

(22) Filed: Feb. 1, 2016

(65) Prior Publication Data

US 2016/0170830 A1   Jun. 16, 2016

Related U.S. Application Data

(63) Continuation of application No. 13/899,553, filed on May 21, 2013, now Pat. No. 9,280,417.

(51) Int. Cl.
| | |
|---|---|
| *G06F 11/00* | (2006.01) |
| *G06F 11/10* | (2006.01) |
| *G11C 14/00* | (2006.01) |
| *G11C 29/02* | (2006.01) |
| *G11C 29/52* | (2006.01) |

(52) U.S. Cl.
CPC .......... *G06F 11/1004* (2013.01); *G06F 11/00* (2013.01); *G06F 11/106* (2013.01); *G06F 11/1016* (2013.01); *G06F 11/1048* (2013.01); *G11C 14/0045* (2013.01); *G11C 29/024* (2013.01); *G11C 29/52* (2013.01)

(58) Field of Classification Search
CPC .. G06F 11/1004; G06F 11/00; G06F 11/1048; G06F 11/106
See application file for complete search history.

(56) References Cited

U.S. PATENT DOCUMENTS

| | | |
|---|---|---|
| 5,954,831 A | 9/1999 | Chang |
| 6,550,023 B1 | 4/2003 | Brauch et al. |
| | | (Continued) |

OTHER PUBLICATIONS

"Non-Final Office Action Issued in U.S. Appl. No. 13/899,553", dated Jul. 13, 2015, 11 Pages.

(Continued)

*Primary Examiner* — Esaw Abraham
(74) *Attorney, Agent, or Firm* — Jonathan M. Waldman (57) ABSTRACT

A codeword is generated from a message. One or more anchor values are appended to the codeword at predetermined anchor positions. Before the codeword is stored in a memory block, the locations and values of stuck cells in the memory block are determined. Based on the values and positions of the stuck cells, the values of the codeword are remapped so that values of the codeword that are the same as the values of the stuck cells are placed at the positions of the stuck cells. The remapped codeword is stored in the memory block. When the message is later read, the original codeword can be recovered from the remapped codeword based on the locations of the anchor values in the remapped codeword.

20 Claims, 6 Drawing Sheets

(56) References Cited

U.S. PATENT DOCUMENTS

| | | | |
|---|---|---|---|
| 7,836,374 | B2 | 11/2010 | Klein |
| 8,004,915 | B1 | 8/2011 | Dastidar et al. |
| 8,201,024 | B2 | 6/2012 | Burger et al. |
| 8,255,742 | B2 | 8/2012 | Ipek et al. |
| 8,400,854 | B2* | 3/2013 | Pei .................... G11C 16/3418 365/184 |
| 8,479,062 | B2* | 7/2013 | Franceschini ....... G06F 11/1048 714/723 |
| 8,671,327 | B2 | 3/2014 | Litsyn et al. |
| 8,675,417 | B2 | 3/2014 | Litsyn et al. |
| 8,719,670 | B1* | 5/2014 | Marrow .............. G06F 11/1072 714/755 |
| 8,812,934 | B2* | 8/2014 | Guyot .................... G06F 11/08 714/764 |
| 8,898,544 | B2* | 11/2014 | Franceschini ........... G06F 11/10 714/754 |
| 8,996,955 | B2* | 3/2015 | Franca-Neto ....... G06F 11/1008 714/719 |
| 9,105,339 | B2* | 8/2015 | Twitto .................... G11C 16/16 |
| 2009/0184307 | A1 | 7/2009 | Yoon et al. |
| 2010/0214830 | A1 | 8/2010 | Franceschini et al. |
| 2011/0296258 | A1 | 12/2011 | Schechter et al. |
| 2012/0092923 | A1 | 4/2012 | Bedeschi et al. |
| 2012/0124442 | A1 | 5/2012 | Strauss |
| 2013/0003451 | A1 | 1/2013 | Bedeschi et al. |
| 2013/0054936 | A1 | 2/2013 | Davis |
| 2014/0101366 | A1 | 4/2014 | Davis et al. |

OTHER PUBLICATIONS

Ahn, et al., "Highly Manufacturable High Density Phase Change Memory of 64mb and Beyond", In Proceedings of IEEE International of Electron Devices Meeting, IEDM Technical Digest, Dec. 13, 2004, 4 Pages.

Atwood, Greg, "The Evolution of Phase Change Memory", In Micron Technology Report, Jul. 26, 2010, 5 Pages.

Barg, et al., "Codes in Permulations and Error Correction for Rank Modulation", In Proceedings of IEEE Transactions on Information Theory, vol. 56, Issue 7, Jul. 2010, 8 Pages.

Burr, et al., "Phase Change Memory Technology", In Journal of Vacuum Science and Technology B, vol. 28, Issue 2, Mar. 30, 2010, 49 Pages.

Cho, et al., "Flip-n-Write: A Simple Deterministic Technique to Improve Pram Write Performance, Energy and Endurance", In Proceedings of 42nd Annual IEEE/ACM International Symposium on Microarchitecture, Dec. 12, 2009, 11 Pages.

Datta, et al., "Designing a Fast and Adaptive Error Correction Scheme for Increasing the Lifetime of Phase Change Memories", In Proceedings of IEEE 29th of VLSI Test Symposium, May 1, 2011, 6 Pages.

Dong, et al., "AdaMS: Adaptive MLC/SLC Phase-Change Memory Design for File Storage", In Proceedings of the 16th Asia and South Pacific Design Automation Conference, Jan. 25, 2011, 6 Pages.

Gabizon, et al., "Invertible Zero-error Dispersers and Defective Memory with Stuck-at Errors", In Proceedings of the 16th International Workshop on Randomization and Approximation Techniques in Computer Science, Jun. 10, 2012, 18 Pages.

Henning, John L., "SPEC CPU2006 Benchmark Descriptions", In Newsletter of ACM SIGARCH Computer Architecture News, vol. 34, Issue: 4, Sep. 2006, 17 Pages.

Hutchby, et al., "Emerging Research Devices", Future Lab International, Special Focus: International Technology Roadmap for Semiconductor, Jan. 2009, 60 Pages.

Hwang, et al., "Full Integration and Reliability Evaluation of Phase-Change Ram Based on 0.24 um-CMOS Technologies", In Proceedings of Symposium on VLSI Technology, Digest of Technical Papers, Jun. 10, 2003, 2 Pages.

Ielmini, et al., "Physical Interpretation, Modeling and Impact on Phase Change Memory (PCM) Reliability of Resistance Drift due to Chalcogenide Structural Relaxation", In Proceedings of IEEE International Meeting of Electron Devices, Dec. 10, 2007, 4 Pages.

Ielmini, et al., "Recovery and Drift Dynamics of Resistance and Threshold Voltages in Phase-Change Memories", In IEEE Transactions on Electron Devices, vol. 54, Issue 2, Feb. 2007, 8 Pages.

Ipek, et al., "Dynamically Replicated Memory: Building Reliable Systems from Nanoscale Resistive Memories", In Proceedings of the Fifteenth Edition of ASPLOS on Architectural Support for Programming Languages and Operating Systems, Mar. 13, 2010, 12 Pages.

Jiang, et al., "Trajectory Codes for Flash Memory", In Proceedings of IEEE D International Symposium on Information Theory, Jun. 28, 2009, 11 Pages.

Kuznetsov, et al., "Coding in a Memory with Defective Cells", In Problems of Information Transmission, vol. 10, Issue: 2, Apr. 1974, 7 Pages.

Lee, et al., "Architecting Phase Change Memory as a Scalable Dram Alternative", In Proceedings of the 36th Annual International Symposium on Computer Architecture, Jun. 20, 2009, 12 Pages.

Luk, et al., "Pin: Building Customized Program Analysis Tools with Dynamic Instrumentation", In Proceedings of the ACM SIGPLAN Conference on Programming Language Design and Implementation, Jun. 12, 2005, 11 Pages.

Papandreou et al., "Drift-Tolerant Multilevel Phase-Change Memory", In 3rd IEEE International of Memory Workshop, May 22, 2011, 4 Pages.

Pozidis, et al., "Enabling Technologies for Multilevel Phase-Change Memory", Retrieved from <<http://www.epcos.org/library/papers/pdf_2011/Oral-Papers/S7-03.pdf>>, Retrieved on Feb. 28, 2013, 8 Pages.

Qureshi, et al., "Enhancing Lifetime and Security of PCM-Based Main Memory with Start-Gap Wear Leveling", In Proceedings of the 42nd Annual IEEE/ACM International Symposium on Microarchitecture, Dec. 12, 2009, 10 Pages.

Qureshi, et al., "Morphable Memory System: A Robust Architecture for Exploiting Multi-Level Phase Change Memories", In Proceedings of the 37th Annual International Symposium on Computer Architecture, Jun. 19, 2010, 10 Pages.

Qureshi, Moinuddin K., "Pay-As-You-Go: Low Overhead Hard-Error Correction for Phase Change Memories", In Proceedings of the 44th Annual IEEE/ACM International Symposium on Microarchitecture, Dec. 3, 2011, 11 Pages.

Qureshi, et al., "Scalable High Performance Main Memory System Using Phase-Change Memory Technology", In Proceedings of the 36th Annual International Symposium on Computer Architecture, Jun. 20, 2009, 10 Pages.

Ralph, et al., "Spin Transfer Torques", In Journal of Magnetism and Magnetic Materials, vol. 320, Issue: 7, Apr. 2008, 27 Pages.

Raoux, et al., "Phase-change Random Access Memory: A Scalable Technology", In IBM Journal of Research and Development, vol. 52, Issue: 4.5, Jul. 2008, 15 Pages.

Schechter, et al., "Use ECP, not ECC, for Hard Failures in Resistive Memories", In Proceedings of ACM SIGARCH Computer Architecture News, vol. 38, Issue: 3, Jun. 19, 2010, 12 Pages.

Seong, et al., "SAFER: StuckAtFault Error Recovery for Memories", In Proceedings of the 43rd Annual IEEE/ACM International Symposium on Microarchitecture, Dec. 4, 2010, 10 Pages.

Seong, et al., "Security Refresh: Prevent Malicious Wear-out and Increase Durability for Phase-Change Memory with Dynamically Randomized Address Mapping", In Proceedings of the 37th Annual International Symposium on Computer Architecture, Jun. 19, 2010, 12 Pages.

Strukov, et al., "The Missing Memristor Found", In Nature-International weekly Journal of Science, vol. 453, May 1, 2008, 4 Pages.

Tsybakov, Boris Solomonovich, "Additive Group Codes for Defect Correction", In Problems of Information Transmission, vol. 11, Issue: 1, Jan. 1975, 3 Pages.

Yang, et al., "A Low Power Phase-Change Random Access Memory using a Data-Comparison Write Scheme", In Proceedings of IEEE International Symposium on Circuits and Systems, May 27, 2007, pp. 3014-3017.

(56) References Cited

OTHER PUBLICATIONS

Yehezkeally, et al., "Snake-in-the-Box Codes for Rank Modulation", In IEEE Transactions on Information Theory, vol. 58, Issue: 8, Aug. 2012, 13 Pages.
Yoon, et al., "Free-p: Protecting Non-volatile Memory against Both hard and Soft Errors", In Proceedings of 17th International Symposium on High Performance Computer Architecture, Feb. 12, 2011, 12 Pages.
Zhang, et al., "Characterizing and Mitigating the Impact of Process Variations on Phase Change based Memory Systems", In Proceedings of the 42nd Annual IEEE/ACM International Symposium on Microarchitecture, Dec. 12, 2009, 12 Pages.
Zhang, et al., "Exploring Phase Change Memory and 3D Die-Stacking for Power/Thermal Friendly, Fast and Durable Memory Architectures", In 18th International Conference on Parallel Architectures and Compilation Techniques, Sep. 12, 2009, pp. 101-112.
Zhang, et al,, "Helmet: A Resistance Drift Resilient Architecture for Multi-level Cell Phase Change Memory System", In Proceedings of 41st IEEE/IFIP International Conference on Dependable Systems & Networks, Jun. 27, 2011, 12 Pages.
Zhou, et al., "A Durable and Energy Efficient Main Memory Using Phase Change Memory Technology", In Proceedings of the 36th Annual International Symposium on Computer Architecture, Jun. 20, 2009, 10 Pages.

* cited by examiner

MESSAGE STORAGE IN MEMORY BLOCKS USING CODEWORDS

CROSS-REFERENCE TO RELATED APPLICATIONS

This application is a continuation of U.S. application Ser. No. 13/899,553, filed on May 21, 2013 and issued as U.S. Pat. No. 9,280,417 on Mar. 8, 2016, the disclosure of which is hereby incorporated in its entirety.

BACKGROUND

Silicon process technology continues to shrink the feature size of devices causing more process variation. As a result, charged-based memory storage technologies, such as dynamic random access memory (DRAM), may no longer scale with successive technology generations.

Phase change memory (PCM) is a potential replacement for DRAM in computers and other digital devices. Like many other non-volatile memories, PCM has a limited lifetime or durability. Typically, over time, one or more cells of the blocks of a PCM device may become stuck and can no longer be reliably written to.

Multi-level cell (MLC) PCM has the added challenge of cell drift. After the cell is programmed, the absolute value of the cell can drift, increasing the cell's resistance over time. MLC PCM wears out much faster than DRAM, making solutions that extend the life of the MLC PCM block and the capacity of the MLC PCM memory system desirable. Other memory technologies may have similar issues, such as Conductive Bridging RAM (CBRAM), for example.

SUMMARY

A codeword is generated from a message. The anchor values are selected so that they are different from other values in the codeword. Before the codeword is stored in a memory block, the locations and values of stuck cells in the memory block are determined. Based on the values and positions of the stuck cells, the values of the codeword are remapped so that values of the codeword that are the same as the values of the stuck cells are placed at the positions of the stuck cells. The remapped codeword is stored in the memory block. When the message is later read, the original codeword can be recovered from the remapped codeword based on the locations of the anchor values in the remapped codeword.

In an implementation, a message to store in a memory block is received by a computing device. The memory block comprises a plurality of cells, and each cell has a value chosen from a plurality of values. A first string is generated from the message by the computing device. The first string comprises a plurality of positions, and each position corresponds to a cell of the plurality of cells, and each position has a value of the plurality of values. A plurality of stuck cells of the plurality of cells is determined by the computing device. A value of each of the stuck cells is determined by the computing device. A second string is generated by the computing device using: a) a mapping function; b) the first string; c) the determined value of each of the stuck cells; and d) the positions of the first string corresponding to the stuck cells. The second string is stored in the memory block by the computing device.

In an implementation, a message to store in a memory block is received by a computing device. The memory block comprises a plurality of cells and each cell has a value of a plurality of values. A first string is generated from the message by the computing device. The first string comprises a plurality of positions. Each position corresponds to a cell of the plurality of cells, and each position has a value of the plurality of values. A value of a stuck cell of the plurality of cells of the memory block is determined by the computing device. A difference between the value of the stuck cell and the value of the position of the first string corresponding to the stuck cell is determined by the computing device. The determined difference is added to each value of the first string to generate a second string by the computing device. The second string is stored in the memory block by the computing device.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
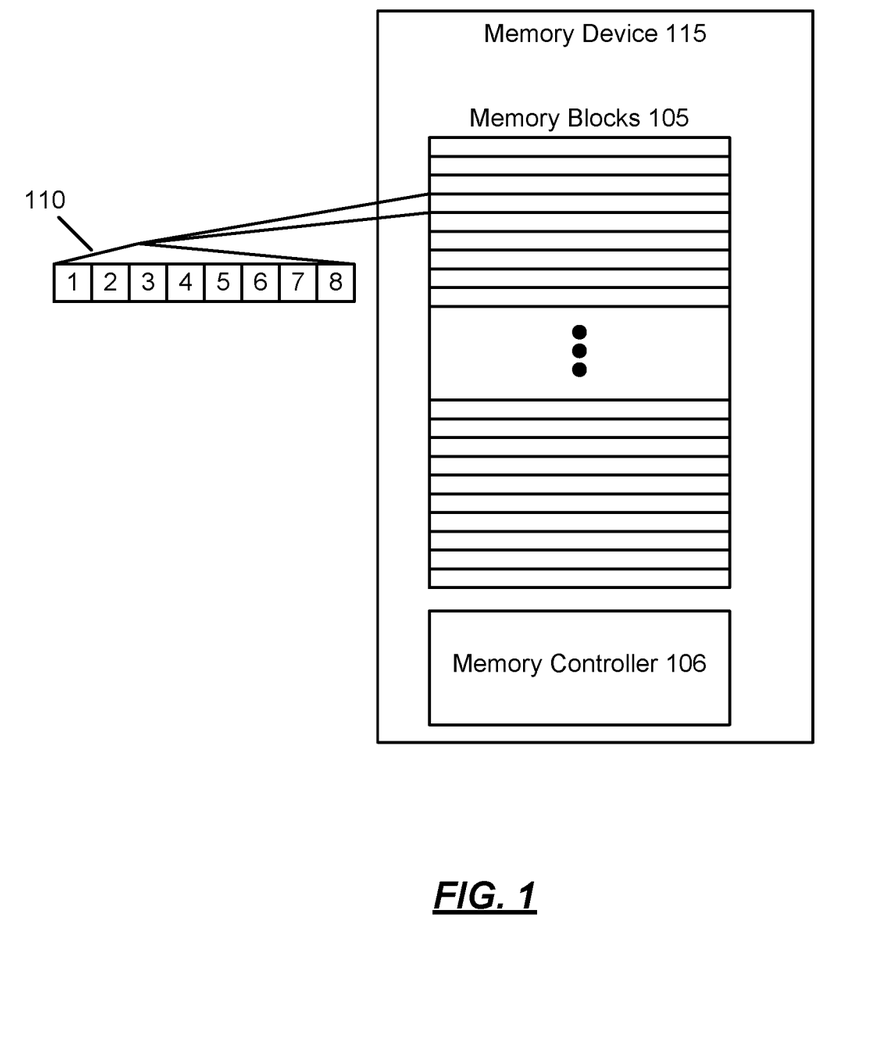
FIG. 1 is an illustration of an example memory device.

FIG. 1 is an illustration of an example memory device 115. One or more applications may perform one or more memory operations with respect to the memory device 115. The operations may include read and write operations. In some implementations, the memory device 115 may be a multi-level cell phase change memory (MLC PCM) device; however, other types of memory devices may be supported such as Conductive Bridging RAM (CBRAM) devices. An example of the memory device 115 may be comprised within a computing system, or may comprise a computing system, such as the computing system 600 described with respect to FIG. 6.

The memory device 115 may include a memory controller 106. The memory controller 106 may receive memory operations for one or more memory blocks 105. The memory controller 106 may fulfill the memory operations using the one or more memory blocks 105. A memory block 105 may include multiple cells, and each cell may correspond to a position of a plurality of positions. Each cell may store one or more values. Each value may correspond to a different resistance level. For example, a memory block 110 is shown that includes positions 1-8.

In some implementations, the memory controller 106 may receive write operations that include a message. A message, as used herein, refers to the data that a user or process associated with the write operation wants to write to the memory blocks 105.

As described above, memory blocks 105, particularly MLC PCM memory blocks, may suffer from one or more stuck cells. As used herein, a cell is stuck if it no longer can be written to or has otherwise failed. To make use of stuck cells, the memory controller 106 may generate a codeword using the provided message. The codeword may be a string. The string may include a plurality of positions, and each position may have a value that is chosen from a plurality of values. Each value of the plurality of values may correspond to a different resistance level supported by the memory device 115. Each position may correspond to a cell of the memory block 105.

The memory controller 106 may generate a codeword from a message using a code generating function. Depending on the implementation, the code generating function may generate a string of length 2 m from the message using an alphabet of values S between $\{0, \ldots, m-1\}$. Each alphabet value may be used twice in the generated string. Each value of the alphabet of values may correspond to a resistance level supported by the memory controller 106. Other types of codeword generating functions may be used.

As further described above, MLC PCM memory blocks 105 may also suffer from cell drift. Over time, the values stored in the cells of a memory block 105 may drift to a higher value or resistance level. The memory controller 106 may correct for the drift by reducing the values stored in the cell of the memory block 105. While implementations are described with respect to resistive memories, it is for illustrative purposes only; any type of memory that is susceptible to stuck cells and/or drift may be supported.

When generating the codeword, the memory controller 106 may further generate one or more anchor values. The number of anchor values generated may correspond to the number of stuck cells that may be supported by the memory controller 106. For example, in implementations where one stuck cell is supported, one anchor value may be generated, and in implementations where three stuck cells are supported, three anchor values may be generated. The anchor values may be selected from the alphabet of values used to generate the codeword, and may not be used in other positions of the codeword. In addition, the maximum and minimum values may not be used for the anchor values.

The memory controller 106 may further append or place the generated anchor values in the generated codeword at what are referred to as anchor positions. In some implementations, the anchor positions may be in front of the generated codeword (i.e., the first two positions), or in the back of the generated codeword (i.e., the last two positions). Other positions may be used.

The memory controller 106 may determine the location and values of any stuck cells. A stuck cell may be a cell whose value can no longer be changed. Any stuck cells may have a value that is either the minimum or maximum value that is supported by the memory controller 106.

When the memory controller 106 receives a request to store a message in a memory block 105, the memory controller 106 may determine if there are any stuck cells in the memory block 105. If no stuck cells are determined, the memory controller 106 may generate a codeword from the message, may append the one or more anchor values to the codeword at the predetermined anchor positions, and may store the codeword with the one or more anchor values to the memory block 105.

If the memory controller 106 determines that there are one or more stuck cells, the memory controller 106 may determine position and values of the one or more stuck cells. The memory controller 106 may use a mapping function to generate a new string from the codeword and one or more anchor values where the values of the new string at the positions associated with the one or more stuck cells are the same as the values of the one or more stuck cells. The mapping function may be a permutation of codeword coordinates or values. For example, the mapping function may rearrange the positions of the codeword and one or more anchor values, or may add a common value to each value and anchor value of the codeword. The new string may be stored in the memory block 105. The memory controller 106 may use metadata associated with the memory block 105 to indicate that the codeword has been remapped along with the number of stuck cells.

At a later time, the memory controller 106 may receive a request to read the message from the memory block 105. The memory controller 106 may retrieve the string stored in the memory block 105. Based on the metadata, the memory controller 106 may determine if the codeword was remapped. If the codeword was not remapped, then the memory controller 106 may determine that the string is the original codeword with the one or more anchor values, and may recover the message from the original codeword by reversing the code generation function that was applied. The recovered codeword may be returned in response to the request to read the message.

If the codeword was remapped, depending on the implementation, based on the position of the one or more anchor values in the retrieved string, and/or the value or values in the predetermined one or more anchor positions, the memory controller 106 may determine the mapping that was applied by the mapping function and may recover the original codeword and one or more anchor values from the retrieved string. The message may be recovered from the original codeword and returned in response to the request as described above. Further details of the memory controller 106 are described below with respect to FIG. 2, for example.

Figure 2:
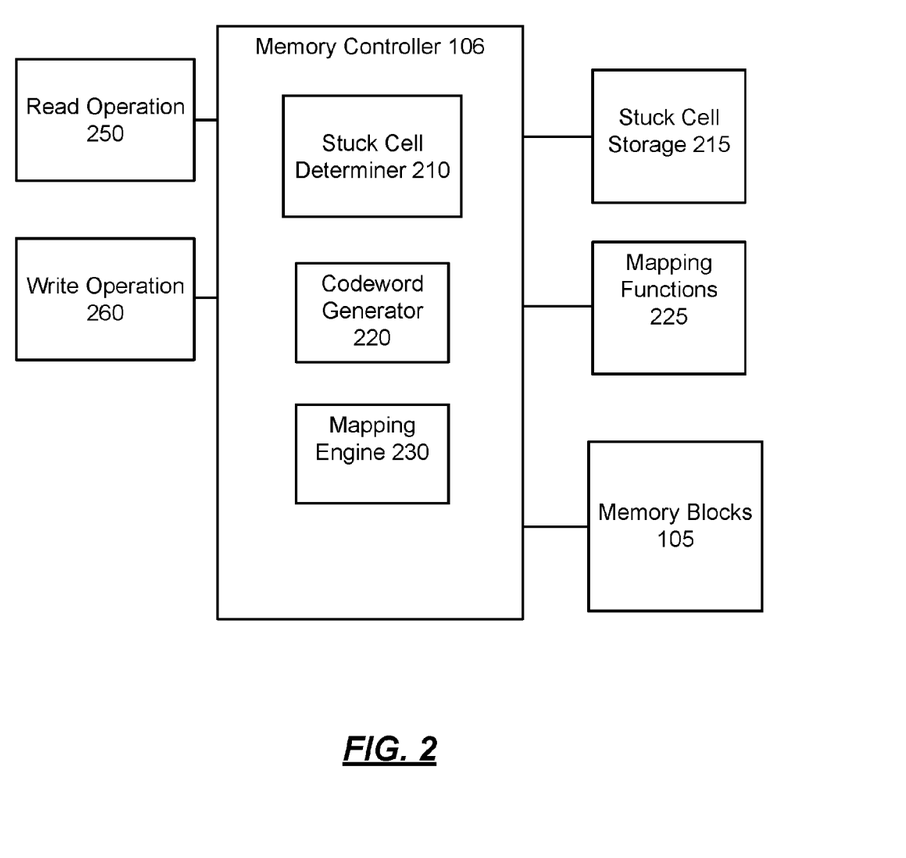
FIG. 2 is an illustration of an example memory controller.

FIG. 2 is an illustration of an example memory controller 106. The memory controller 106 may include one or more components including, but not limited to, a stuck cell determiner 210, a codeword generator 220, and a mapping engine 230. More or fewer components may be supported. The memory controller 106, and each of its individual components, may be implemented using one or more general purpose computing devices such as the computing system 600 illustrated in FIG. 6.

The stuck cell determiner 210 may determine zero or more stuck cells for the memory controller 106. In some implementations, the stuck cell determiner 210 may determine zero or more stuck cells in a memory block 105 in response to a write operation 260. For example, the stuck cell determiner 210 may determine if there are any stuck cells in a memory block 105 before writing any data associated with the write operation 260.

In other implementations, the stuck cell determiner 210 may determine stuck cells in all of the memory blocks 105 at once, or in batches. For example, during periods of inactivity, the memory controller 106 may determine stuck cells in the memory blocks 105. The stuck cells may be stuck at either the maximum or minimum value that may be stored in the cells of the memory blocks 105. Thus, in a cell that can store the values 0, 1, 2, and 3, the values of the stuck cells may be either 0 or 3.

In some implementations, the stuck cell determiner 210 may determine stuck cells in a memory block 105 by performing an XOR operation of the data stored in the memory block with the inverse of the data stored in the memory block. Indicators of any determined stuck cells may be stored by the stuck cell determiner in a stuck cell storage 215. Any type of data structure may be used for the stuck cell storage 215.

In some implementations, the stuck cell determiner 210 may determine stuck cells in a memory block 105 by indexing into a stuck cell storage cache using the memory block 105 address to find the error location vector. If the error location vector is found, the error location vector can be used as the indicator of any stuck cells. After the write operation 260, any new error locations can be updated in the stuck cell storage 215 as a result of the normal read-write-verify process.

The codeword generator 220 may receive a write operation 260 that includes an identifier of a memory block 105 and a message. The message may comprise data that a user desires to write the memory block 105. The codeword generator 220 may generate a codeword from the message using any one of a variety of codeword generating functions.

In implementations where only one stuck cell is tolerated by the memory controller 106, the codeword generator 220 may generate the codeword from the message by generating a string of length 2 m over an alphabet of values S= $\{0, \ldots, m-1\}$ of size m, where m is an integer, and where each value in the alphabet occurs twice in a position of the string. In addition, in some implementations, each generated string may begin with the value '0' in the first position of the string. Other values and/or positions may be used. For example, in an alphabet of values $\{0, 1, 2\}$ valid strings may include, but are not limited to "010212", "021120", "012201", and "002121". In these implementations, the first position of the generated string is the anchor position and the initial value "0" is the anchor value.

In implementations where two stuck cells are tolerated by the memory controller 106, the codeword generator 220 may generate the codeword from the message by generating a string of length 2 m−2 over an alphabet of values S= $\{0, \ldots, m-1\}$ of size m, where m is an integer, and where each value occurs twice in a position of the string except for two special anchor values each that occur only once. The anchor values may be any values besides 0 and m−1, and may occur in the generated string at the predetermined anchor positions. In some implementations, the anchor positions are the first two positions of the string. However, other positions may be used.

For example, in an alphabet of values $\{0, 1, 2, 3\}$, valid strings may include "123300", "123030", "120033", and "120303". In these implementations, the first two positions of the generated string are the anchor positions, and the values "1" and "2" are the anchor values.

In implementations where three stuck cells are tolerated by the memory controller 106, the codeword generator 220 may generate the codeword from the message by generating a string of length 3 m−6 over an alphabet of values S= $\{0, \ldots, m-1\}$ of size m, where m is an integer, and where each value occurs thrice in a position of the string except for three special anchor values that each occur only once. The anchor values may be any values besides 0 and m−1, and may occur in the generated string at the predetermined anchor positions. In some implementations, the anchor positions are the first three positions of the string. However, other positions may be used.

The mapping engine 230 may generate a mapped string from a codeword or string based on the stuck cells of a memory block 105 where the codeword is to be stored. The mapping engine 230 may determine the stuck cells using information from the stuck cell storage 215.

The mapping engine 230 may generate the mapped string using one or more mapping functions 225. The particular mapping functions 225 used may depend on the number of stuck cells that are tolerated by the memory controller 106. The mapping function 225 may take as an input the codeword with one or more anchor values, the locations and values of the stuck cells, and may return a mapped string. The mapping engine 230 may store the mapped string in the memory block 105 identified by the write operation.

In implementations where the memory controller 106 tolerates one stuck cell, the mapping function 225 may be what is referred to as a shift function. In the shift function, the mapping engine 230 may determine the value and position of the stuck cell in the memory block 105. The mapping engine 230 may determine the value of the codeword at the position corresponding to the position of the stuck cell. The mapping engine 230 may determine a difference between the value of the stuck cell and the value of the codeword at the position of the stuck cell. The determined difference may be added to each value of the codeword modulo the size of the alphabet of values.

For example, a codeword using an alphabet of values $\{0, 1, 2, 3\}$ may be "01023123". As shown, the codeword includes a zero at the first anchor position. The memory block 105 may include a stuck cell with a value of zero at the second to last position in the memory block 105. The corresponding position in the codeword has a value of two. The memory controller 106 may determine that the difference between the value of the stuck cell and the value of the corresponding position in the codeword is two. The mapping engine 230 may add two to each value of the codeword modulo four, resulting in the string "23201301".

In implementations where the number of stuck cells is two or more, the mapping engine 230 may determine the mapped string from a codeword using a permutation function. In the permutation function, the mapping engine 230 may determine the value and positions of the stuck cells in the memory block 105. The mapping engine 230 may determine a permutation of the codeword where the values of the positions in the codeword that correspond to the stuck cells have the same values as the stuck cells. A permutation of the codeword may be determined by shuffling or rearranging the values of the positions of the codeword.

In some implementations, the mapping engine 230 may generate a set of unique permutations $\Pi_k$ of the codeword n where k is the number of stuck cells that memory controller 106 can tolerate. The set of permutations $\Pi_k$ may have the property that for any k target positions $i_1, \ldots, i_k$ and for any positions $i'_1, \ldots, i'_k$ there exists one permutation $\pi \in \Pi_k$ such that $\pi(i_j') = i_j$ for every position $i \in \{1, \ldots, k\}$. A set of permutations may be generated for each possible codeword and stored by the mapping engine 230 with the mapping functions 225. For implementations where k=2, n may be a prime power. For implementations where k=3, n may be a prime power plus one. The mapping engine 230 may calculate permutations for one or more possible codeword values and stuck cell locations using the mapping functions 225.

The memory controller 106 may later receive a read operation 250 requesting to read a message from a memory block 105. Based on the positions of the one or more anchor values, the mapping engine 230 may determine if the stored codeword in the memory block 105 was remapped due to one or more stuck cells. If the mapping engine 230 determines that the codeword was not remapped, then the codeword generator 220 may recover the original message by reversing the codeword generating function used to generate the stored codeword. The message may be returned in response to the read operation 250.

If the mapping engine 230 determines that the codeword was remapped, how the mapping engine 230 proceeds may depend on the number of stuck cells that are supported by the memory controller 106. In implementations where one stuck cell is supported, the value of the codeword at the anchor position may indicate the difference that was added to each value to remap the codeword. For example, as described above in implementations that use the shift function, the remapped codeword was generated by adding a difference to each value of the codeword including the value at the anchor position. Because the original value of the anchor position was set to zero by the codeword generator 220, the new value of the anchor position may be used by the mapping engine 230 to recover the original codeword by subtracting the new value from the value of each position modulo m. The original codeword may be used by the codeword generator 220 to recover the message as described above.

In implementations with two or more stuck cells, the mapping engine 230 may retrieve the remapped codeword from the memory block 105, and based on the positions of the two or more anchor values in the remapped codeword, the mapping engine 230 may recover the original codeword. As described above, the set of permutations $\Pi_k$ may have the property that there exists one permutation $\pi \in \Pi_k$ such that $\pi(i_j') = i_j$ for every position $i \in \{1, \ldots, k\}$. The recovered permutation may be inverted by the mapping engine 230 to recover the original codeword. The original codeword may be used by the codeword generator 220 to recover the message as described above.

In another implementation, the codeword generator 220 may generate a codeword from a message using a non-uniform distribution of values from an alphabet of values. Thus, unlike the implementations described above, each value may not appear in the codeword the same number of times. In addition, similarly as before, the one or more anchor values may have any value except the highest or lowest value.

For two stuck cells, the mapping engine 230 may determine a remapped codeword from a codeword using the linear equation $y=ax+b$ over a finite field. The y coordinates in the equation correspond to the positions of the stuck cells in the memory block 105 where the codeword may be stored, and the x coordinates correspond to the original positions of the codeword that will be moved to the stuck locations. These constraints determine the values of a, b. The linear equation may be used to remap all of the values of the codeword (including the anchor values), and the remapped codeword may be stored by the mapping engine 230.

In implementations where three stuck cells are supported, the coordinates of the codewords correspond to points in one-dimensional projective space over a finite field F. This means that coordinates are represented by non-zero pairs $(x_1, x_2)$, considered up to scaling. The mapping engine 230 may use a family of permutations called Mobius transformations to permute the coordinates.

A permutation in this family is specified by a, b, c, d over a finite field where $ad-bc=1$. Such a permutation maps $(x_1, x_2)$ to $(ax_1+bx_2, cx_1+dx_2)$. Because $ad-bc=1$, the mapping is invertible. Given 3 stuck cells, fixing three coordinates that may map to these stuck cells gives three equations in a, b, c, d. Together with the equation $ad-bc=1$, this specifies the permutation uniquely. The equation may be used to remap all of the values of the codeword (including the anchor values), and the remapped codeword may be stored by the mapping engine 230.

When a read operation 250 is later received for the memory block 105, the positions of the anchor values in the remapped codeword may be used by the mapping engine 230 to reconstruct the equation that was used to generate the remapped codeword. The reconstructed equation may be used to recover the original codeword. The codeword may be used by the codeword generator 220 to recover the message, and the message may be provided in response to the read operation 250.

Figure 3:
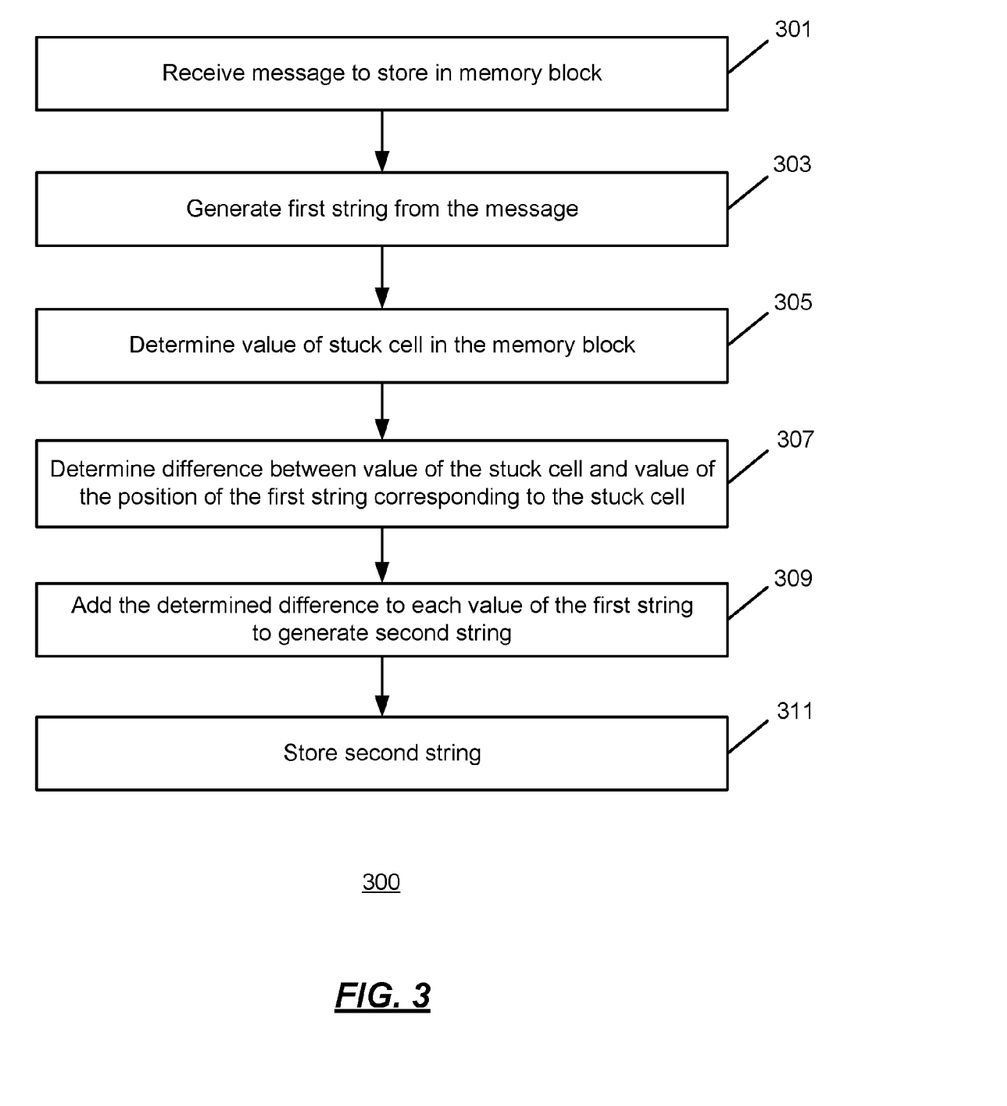
FIG. 3 is an operational flow of an implementation of a method for remapping a codeword based on a value and position of one stuck cell in a memory block.

FIG. 3 is an operational flow of an implementation of a method 300 for remapping a codeword based on a value and position of one stuck cell in a memory block. The method 300 may be implemented by the memory controller 106, for example.

A message to store in a memory block is received at 301. The message may be received by memory controller 106. The message may be received as part of a write operation 260. The memory block 105 may include a plurality of cells and each cell may have one of a plurality of positions. Each cell may store one of a plurality of values. The values may correspond to resistances in an implementation, or other physical characteristics in other implementations.

A first string is generated from the message at 303. The first string may comprise a codeword and may be generated by the codeword generator 220. The first string may have a plurality of positions, each position may have a value, and each position may correspond to a position of a cell of the memory block 105. Anchor values may be added to the first string. In some implementations, the codeword may be generated from an alphabet of values and each value of the alphabet may occur twice or thrice in the generated first string depending on the number of stuck cells that are supported. In addition, the first string may begin with a predetermined value of the alphabet of values. For example, the first string may begin with a zero. Other values may be used.

A value of a stuck cell in the memory block is determined at 305. The value of a stuck cell may be determined by the stuck cell determiner 210 of the memory controller 106. The value of the stuck cell may be determined by the stuck cell determiner 210 using information regarding stuck cells in the stuck cell storage 215. The stuck cell determiner 210 may also determine a position of the stuck cell in the memory block.

A difference between the value of the stuck cell and the value of the position of the first string that corresponds to the stuck cell is determined at 307. The difference may be determined by the mapping engine 230. The determined difference is added to each value of the first string to generate a second string at 309. The difference may be added to each value of the first string modulo the size of the alphabet of values to generate a first string by the mapping engine 230. The second string is stored at 311. The second string may be stored by the memory controller 106 in the memory block identified by the write operation 260.

At a later time, when a read operation 250 is received for the same memory block 105, the mapping engine 230 may recover the first string from the stored second string by determining the value at the first position of the second string. As described above, the generated codeword began with a zero at the first position, and the second string was generated from the first string by adding the determined difference to each value. Thus, the first position may now have a value that is the same as the determined difference. The mapping engine 230 may recover the first string from the second string by subtracting the determined difference from each value of the second string modulo the alphabet size. The codeword generator 220 may recover the original stored message using the first string. The message may be provided in response to the read operation 250.

Figure 4:
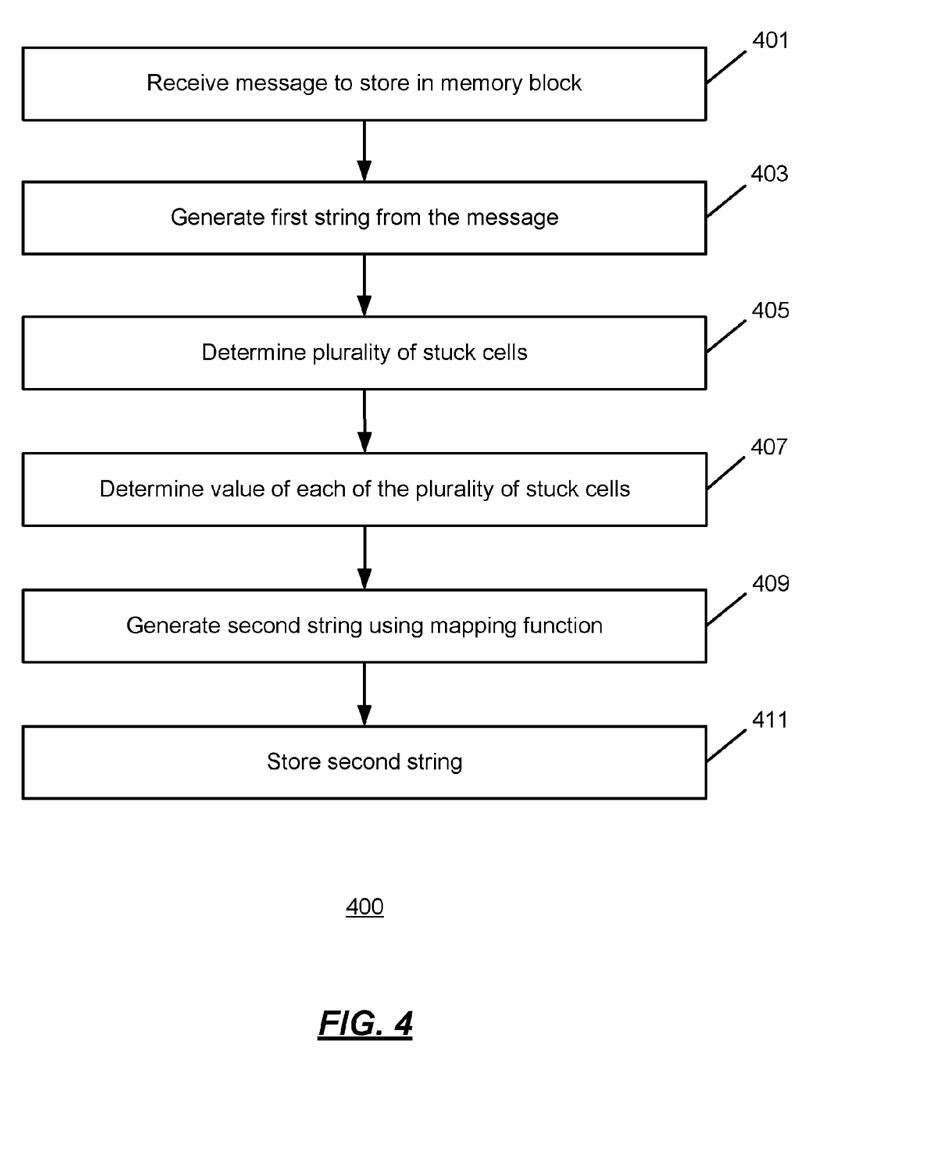
FIG. 4 is an operational flow of an implementation of a method for remapping a codeword based on values and positions of two or more stuck cells in a memory block.

FIG. 4 is an operational flow of an implementation of a method 400 for remapping a codeword based on values and positions of two or more stuck cells in a memory block. The method 400 may be implemented by the memory controller 106, for example.

A message to store in a memory block is received at 401. The message may be received by a memory controller 106. The message may be received as part of a write operation 260. The memory block 105 may include a plurality of cells, and each cell may store one of a plurality of values.

A first string is generated from the message at 403. The first string may comprise a codeword and may be generated by the codeword generator 220. The first string may have two or more anchor positions. The anchor positions may be in predetermined positions of the first string and may have values that are reserved for the anchor positions. The anchor positions may be the first two positions of the first string, in an implementation. Other positions may be used, depending on the implementation. The number of anchor positions may be equal to the number of stuck cells that are tolerated by the memory controller 106. For two stuck cells there may be two anchor positions, and for three stuck cells there may be three anchor positions, for example.

A plurality of stuck cells is determined at 405. The stuck cells are determined by the stuck cell determiner 210 of the memory controller 106. A value of each of the plurality of stuck cells is determined at 407. The value of each of the plurality of stuck cells is determined by the stuck cell determiner 210. In some implementations, the values of the stuck cells may either be the minimum or the maximum value or resistance that is supported by the memory controller 106. In addition, the stuck cell determiner 210 may determine the locations of the stuck cells.

A second string is generated from the first string using a mapping function at 409. The second string may be generated from the first string using a mapping function of the mapping functions 225 and the positions and values of the stuck cells. The second string may be generated from the first string by rearranging the values of the positions of the first string such that positions of the first string that have the same values as the stuck cells are moved to the positions associated with the stuck cells. In some implementations, the mapping function may comprise a linear function. Alternatively, the mapping engine 230 may select a second string from a plurality of permutations of strings generated based on different positions of the stuck cells. The permutations may have been pre-calculated or otherwise predetermined for each possible value of a first string and stuck cells in the memory controller 106. As may be appreciated, because of the rearrangement of positions of the first string when generating the second string, the positions of the anchor values may be different in the second string than in the first string.

The second string is stored at 411. The second string may be stored by the memory controller 106 in the memory block identified by the write operation 260.

At a later time, when a read operation 250 is received for the same memory block 105, the mapping engine 230 may recover the first string from the stored second string by determining the new positions of the anchor values in the second string. As described above, the generated codeword included anchor values at predetermined anchor positions in the codeword. The mapping engine 230 may recover the first string from the second string based on the new positions of the anchor values in the second string. For example, the mapping engine 230 may determine the linear function that was used to generate the second string based on the new positions of the anchor values, or may determine the first string by determining the string having a permutation that matches the second string. The codeword generator 220 may recover the original stored message using the first string. The message may be provided in response to the read operation 250.

Figure 5:
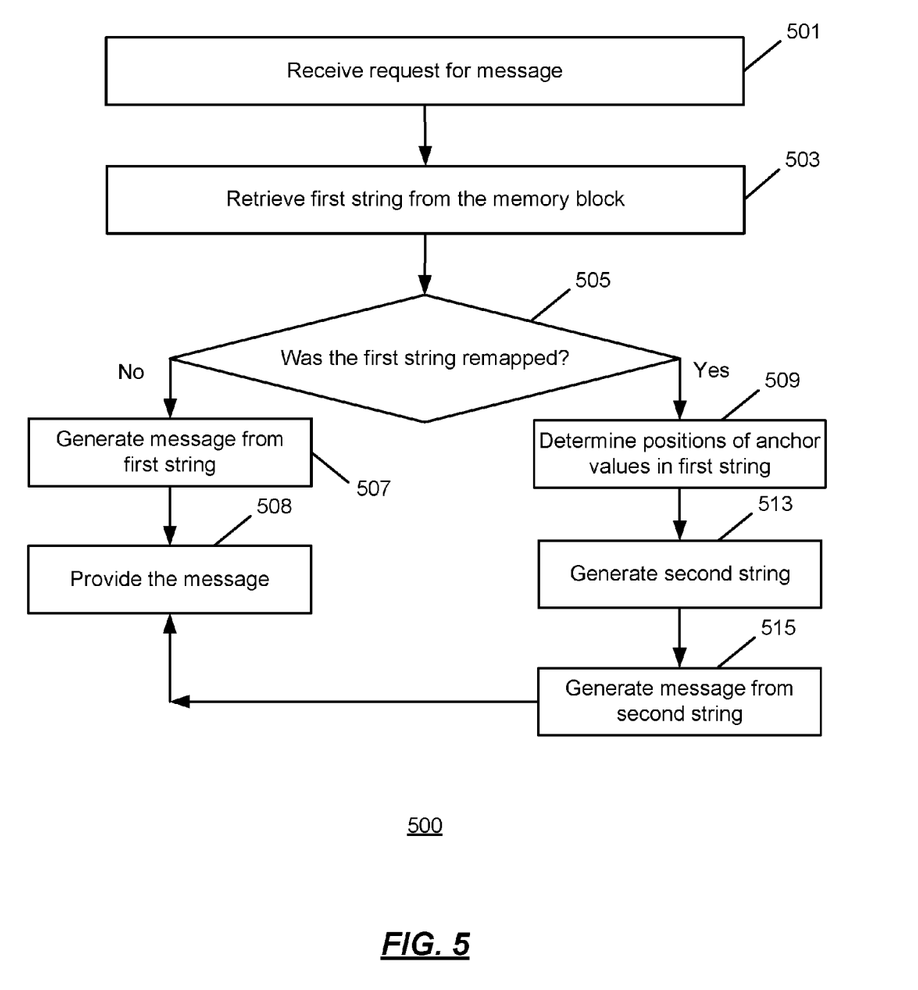
FIG. 5 is an operational flow of an implementation of a method for recovering a message from a stored codeword.

FIG. 5 is an operational flow of an implementation of a method 500 for recovering a message from a stored codeword. The method 500 may be implemented by the memory controller 106, for example.

A request for a message is received at 501. The request may be part of a read operation 250 and may be received by the memory controller 106. The request may identify a memory block 105 where the message is stored. The memory block may include a plurality of cells, and each cell may have a position in the memory block 105.

A first string is retrieved from the memory block at 503. The first string may be retrieved from the memory block 105 by the memory controller 106. The first string may comprise a plurality of values with positions corresponding to the positions of the cells of the memory block 105.

A determination is made of whether the string was remapped at 505. The determination may be made by the mapping engine 230 of the memory controller 106 using metadata associated with the string. The metadata may also indicate the number of stuck cells associated with the string. If the string was remapped, then the method 500 may continue at 509. Otherwise, the method 500 may continue at 507.

At 507, the message is generated from the first string. The message may be generated by the codeword generator 220 of the memory controller 106 by reversing the particular codeword generation function that was originally used to generate the first string by the codeword generator 220. At 508, the message is provided. The message may be provided by the memory controller 106 in response to the request for the message received at 501.

Positions of anchor values in the first string are determined at 509. The positions of anchor values may be determined by the mapping engine 230 of the memory controller 106. There may be two or three anchor values in the first string, in some implementations. The anchor values may use values that are reserved. In the initial codeword that is generated from the message, the anchor values may be placed in predetermined or expected positions of the codeword (e.g., the first two or three positions). However, when the codeword was remapped to account for one or more determined stuck cells, the positions of the anchor values may have changed. At 513, a second string is generated from the first string. The second string may be generated by the mapping engine 230 using the determined positions of the anchor values in the first string, and the particular mapping function 225 that was used by the mapping engine 230 to generate the first string. The message is generated from the second string at 515. The message may be generated by the codeword generator 220 of the memory controller 106 based on the particular codeword generation function that was originally used to generate the second string by the codeword generator 220. After generating the message, the method 500 may continue at 508 where the message is provided in response to the request for the message by the memory controller 106.

Figure 6:
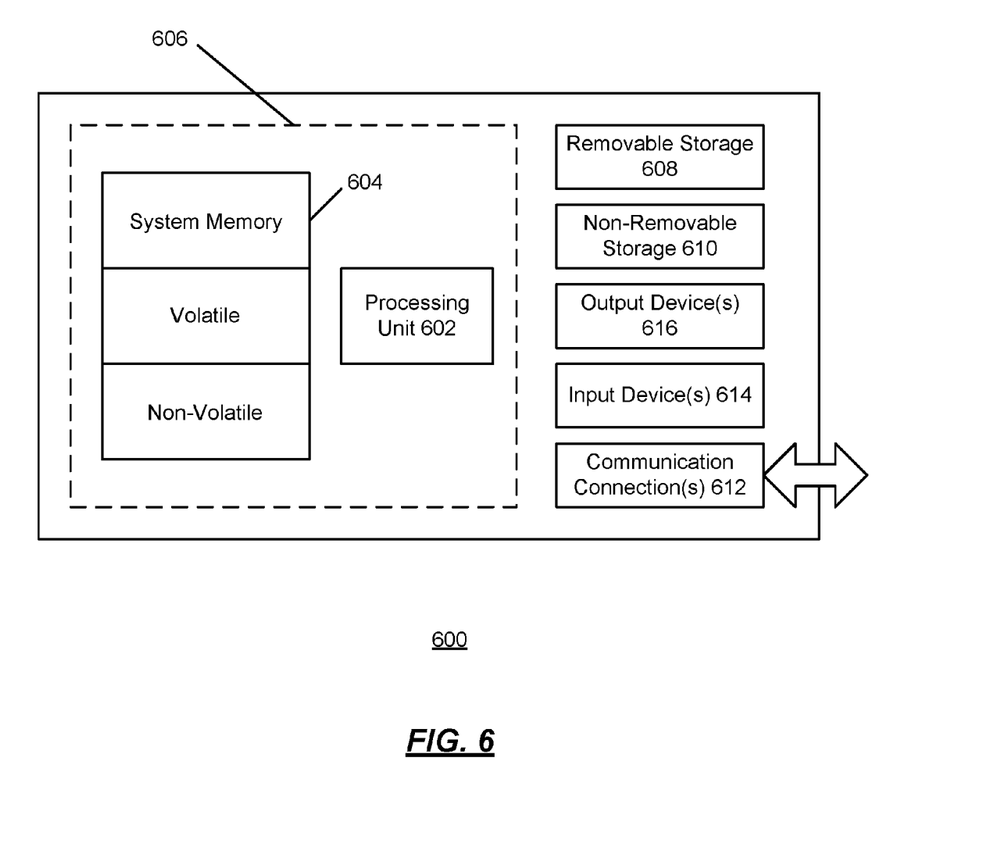
FIG. 6 shows an exemplary computing environment in which example embodiments and aspects may be implemented.

FIG. 6 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, personal computers, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 6, an exemplary system for implementing aspects described herein includes a computing device, such as computing system 600. In its most basic configuration, computing system 600 typically includes at least one processing unit 602 and memory 604. Depending on the exact configuration and type of computing device, memory 604 may be volatile (such as random access memory (RAM)), non-volatile (such as read-only memory (ROM), flash memory, etc.), or some combination of the two. This most basic configuration is illustrated in FIG. 6 by dashed line 606.

Computing system 600 may have additional features/functionality. For example, computing system 600 may include additional storage (removable and/or non-removable) including, but not limited to, magnetic or optical disks or tape. Such additional storage is illustrated in FIG. 6 by removable storage 608 and non-removable storage 610.

Computing system 600 typically includes a variety of computer readable media. Computer readable media can be any available media that can be accessed by computing system 600 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 604, removable storage 608, and non-removable storage 610 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system 600. Any such computer storage media may be part of computing system 600.

Computing system 600 may contain communication connection(s) 612 that allow the device to communicate with other devices. Computing system 600 may also have input device(s) 614 such as a keyboard, mouse, pen, voice input device, touch input device, etc. Output device(s) 616 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving a message to store in a memory block by a computing device, wherein the memory block comprises a plurality of cells, and each cell has a value of a plurality of values;
   generating a first string from the message by the computing device, wherein the first string comprises a plurality of positions and a plurality of anchor values, each position corresponds to a cell of the plurality of cells, and each position has a value of the plurality of values and wherein the number of anchor values equals a number of stuck cells supported by the computing device;
   determining a plurality of stuck cells of the plurality of cells by the computing device, wherein the plurality of stuck cells correspond to cells whose value can no longer be changed;
   determining a value of each of the plurality of stuck cells by the computing device, wherein the value of each of the plurality of stuck cells corresponds to a different resistance level supported by the computing device;
using a mapping function, the first string, the determined value of each of the plurality of stuck cells, the positions of the first string corresponding to the plurality of stuck cells, and the anchor values at predetermined anchor positions to generate a second string, wherein the mapping function comprises a permutation of the values and anchor values; and
outputting the second string to the memory block by the computing device.

2. The method of claim 1, wherein the mapping function is a linear function over a finite field.

3. The method of claim 1, further comprising:
retrieving the stored second string;
determining positions in the second string of the plurality of anchor values;
recovering the first string from the second string based on the determined positions in the second string of the plurality of anchor values and the mapping function;
generating the message based on the first string; and
providing the message.

4. The method of claim 1, wherein the plurality of stuck cells comprises two stuck cells.

5. The method of claim 1, wherein the plurality of stuck cells comprises three stuck cells.

6. The method of claim 1, wherein the computing device comprises a memory controller.

7. The method of claim 1, wherein each value corresponds to a resistance level.

8. A system comprising:
a memory controller;
a plurality of memory blocks; and
a mapping engine adapted to:
receive a message to store in a memory block, wherein the memory block comprises a plurality of cells, and each cell has a value of a plurality of values;
generate a first string from the message, wherein the first string comprises a plurality of positions and a plurality of anchor values, each position corresponds to a cell of the plurality of cells, and each position has a value of the plurality of values and wherein the number of anchor values equals a number of stuck cells supported by the memory controller, wherein the stuck cells correspond to cells whose value can no longer be changed;
using a mapping function, the first string, and the anchor values at predetermined anchor positions to generate a second string, wherein the mapping function comprises a permutation of the values and anchor values; and
output the second string to the memory block.

9. The system of claim 8, wherein the mapping engine is further adapted to:
determine a plurality of stuck cells of the plurality of cells;
determine a value of each of the plurality of stuck cells, wherein the value of each of the plurality of stuck cells corresponds to a different resistance level supported by the memory controller; and
generate the second string using the mapping function, the first string, the determined value of each of the plurality of stuck cells, the positions of the first string corresponding to the plurality of stuck cells, and the anchor values at predetermined anchor positions of the second string.

10. The system of claim 9, wherein the plurality of stuck cells comprises two stuck cells.

11. The system of claim 9, wherein the plurality of stuck cells comprises three stuck cells.

12. The system of claim 9, wherein each value corresponds to a resistance level.

13. The system of claim 8, wherein the mapping function is a linear function over a finite field.

14. The system of claim 8, wherein the mapping engine is further adapted to:
retrieve the stored second string; and
determine positions in the second string of the plurality of anchor values.

15. The system of claim 14, wherein the mapping engine is further adapted to:
recover the first string from the second string based on the determined positions in the second string of the plurality of anchor values and the mapping function;
generate the message based on the first string; and
provide the message.

16. A system comprising:
a memory controller;
a plurality of memory blocks; and
a mapping engine adapted to:
receive a request for a message stored in a memory block of the plurality of memory blocks, wherein each memory block includes a plurality of cells;
retrieve a first string from the memory block, wherein the first string comprises a plurality of positions and a plurality of anchor values, each position has a value of a plurality of values, the number of anchor values equals a number of stuck cells supported by the computing device, wherein the stuck cells correspond to cells whose value can no longer be changed, and each position corresponds to a cell of the plurality of cells;
determine if the first string was remapped; and
if the first string was not remapped, use the first string to generate the message, and output the message in response to the request.

17. The system of claim 16, wherein the mapping engine is further adapted to:
if the first string was remapped:
determine positions of the anchor values in the first string:
generate a second string from the first string based on the determined positions, a mapping function, and the anchor values at predetermined anchor positions of the second string, wherein the mapping function comprises a permutation of the values and anchor values;
generate the message from the second string; and
provide the message in response to the request.

18. The system of claim 17, wherein the memory block is a Phase Change Memory Block.

19. The system of claim 17, wherein the mapping function is a permutation of codeword coordinates or values.

20. The system of claim 17, wherein the plurality of values corresponds to resistance levels.

* * * * *